(12) United States Patent
Koma et al.

(10) Patent No.: US 6,511,895 B2
(45) Date of Patent: Jan. 28, 2003

(54) SEMICONDUCTOR WAFER TURNING PROCESS

(75) Inventors: Yutaka Koma, Tokyo (JP); Kiyoshi Arita, Osaka (JP); Hiroshi Haji, Osaka (JP); Tetsuhiro Iwai, Osaka (JP)

(73) Assignees: Disco Corporation, Tokyo (JP); Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/791,766

(22) Filed: Feb. 26, 2001

(65) Prior Publication Data

US 2001/0021571 A1 Sep. 13, 2001

(30) Foreign Application Priority Data

Mar. 13, 2000 (JP) ........................................ 2000-068229
Mar. 13, 2000 (JP) ........................................ 2000-068230
Mar. 13, 2000 (JP) ........................................ 2000-068231
Jun. 12, 2000 (JP) ........................................ 2000-175312

(51) Int. Cl.$^7$ ............................ H01L 21/30; H01L 21/46
(52) U.S. Cl. ........................ 438/459; 438/690; 438/706; 438/759; 438/928; 438/976; 438/977
(58) Field of Search ................................ 216/2, 38, 41, 216/52, 67, 69, 88; 156/344, 636.1, 637.1, 643.1, 645.1, 659.11; 437/225, 226; 438/459, 460, 469, 690–693, 706–710, 712, 745, 759, 928, 974, 976, 977

(56) References Cited

U.S. PATENT DOCUMENTS 5,693,182 A * 12/1997 Mathuni .................. 156/645.1
6,159,827 A * 12/2000 Kataoka ..................... 438/464

OTHER PUBLICATIONS

El–Kareh, "Fundamentals of Semiconductor Processing Technologies", Chapter 5, pp. 282–285, Kluwer(1995).*

* cited by examiner

Primary Examiner—Michael Sherry
Assistant Examiner—Asok Kumar Sarkar
(74) Attorney, Agent, or Firm—Smith, Gambrell & Russell, LLP (57) ABSTRACT

A semiconductor wafer processing apparatus grinds a surface of a semiconductor wafer by mechanical grinding, and then removes a damaged layer in the ground surface. In the processing apparatus, a grinding portion, a precenter portion, a wafer cleaning portion, plasma treatment portions, and magazines are arranged radially about an origin of a polar coordinate system of a third wafer transport portion having a robot mechanism, and their positions of arrangement are set such that the origin is located on lines of extension of wafer carry-in and carry-out center lines of the plasma treatment portions. Thus, the number of changed grippings of the semiconductor wafer can be minimized to prevent breakage of the semiconductor wafer. Moreover, transfer of the semiconductor wafer between the respective portions can be covered by the single robot mechanism, and the equipment can be made compact.

4 Claims, 11 Drawing Sheets

SEMICONDUCTOR WAFER TURNING PROCESS

FIELD OF THE INVENTION

This invention relates to a semiconductor wafer processing apparatus for grinding a semiconductor wafer to thin it.

DESCRIPTION OF THE PRIOR ART

In a process for manufacturing a semiconductor wafer for use in a semiconductor device, grinding is performed to decrease the thickness of the semiconductor wafer as thin semiconductor devices are becoming predominant. The grinding is carried out by mechanical grinding of a back side of the semiconductor wafer opposite to its face side after a circuit pattern has been formed on the face side. On the surface of the semiconductor wafer after mechanical grinding, there is a damaged layer embrittled by microcracks formed by mechanical grinding. The damaged layer is known to include the microcracks and impair the fracture strength of the semiconductor wafer. Thus, a conventional semiconductor has been used with such a thickness that the semiconductor is not affected by a decrease in the fracture strength due to the damaged layer.

In response to the light weight and compact size of electronic equipment, moves for thinning semiconductor devices to meet demands for their light weight and compact size have become brisk. Along this line, further thinning of semiconductor wafers has also been demanded. To reduce the thickness of the semiconductor wafer, however, the influence of the decrease in the fracture strength due to the damaged layer is becoming nonnegligible. To solve this problem, processing to a small thickness (hereinafter referred to as thinning), including removal of the damaged layer, is necessary. However, any appropriate apparatus, which can perform a series of thinning steps, ranging from mechanical grinding of the semiconductor wafer to removal of the damaged layer, has not existed.

SUMMARY OF THE INVENTION

Under these circumstances, the present invention aims to provide a semiconductor wafer processing apparatus and a semiconductor wafer processing method which can perform a series of thinning steps, ranging from mechanical grinding of a semiconductor wafer to removal of its damaged layer.

According to the present invention, there is provided a semiconductor wafer processing apparatus for grinding a surface of a semiconductor wafer to thin the semiconductor wafer, comprising a grinding portion for mechanically grinding the semiconductor wafer, a wafer cleaning portion for cleaning the semiconductor wafer after mechanical grinding, a damaged layer removal treatment portion for removing a damaged layer, caused to the semiconductor wafer by mechanical grinding, after cleaning by the wafer cleaning portion, and a wafer transport mechanism for transferring the semiconductor wafer between the grinding portion, the wafer cleaning portion, and the damaged layer removal treatment portion.

It is preferred to include a precenter portion for centering the semiconductor wafer, and supply the semiconductor wafer, which has been centered by the precenter portion, to the grinding portion by the wafer transport mechanism. A stocker can be provided for accommodating the semiconductor wafer before processing which is to be supplied to the grinding portion and/or the semiconductor wafer after processing which has been withdrawn from the damaged layer removal treatment portion. The wafer transport mechanism preferably includes a robot mechanism on a polar coordinate system. Preferably, the wafer transport mechanism also includes a before-cleaning transport portion for withdrawing the semiconductor wafer after mechanical grinding from the grinding portion, and passing the semiconductor wafer on to the wafer cleaning portion, and an after-cleaning transport portion for withdrawing the semiconductor wafer after cleaning from the wafer cleaning portion, and passing the semiconductor wafer on to the damaged layer removal treatment portion. The damaged layer removal treatment portion may be a plasma treatment portion for etching the damaged layer by plasma treatment. The damaged layer removal treatment portion may be a wet etching treatment portion for etching the damaged layer with a chemical liquid. Preferably, the wafer transport mechanism comprises a first wafer transport portion for holding the semiconductor wafer from the precenter portion and bringing the semiconductor wafer onto the grinding portion, a second wafer transport portion for withdrawing the semiconductor wafer ground by the grinding portion and transporting the semiconductor wafer to the wafer cleaning portion, and a third wafer transport portion having a robot mechanism on a polar coordinate system for transferring the semiconductor wafer between the precenter portion, the wafer cleaning portion, and the damaged layer removal treatment portion, and the damaged layer removal treatment portion is disposed in a third quadrant and a fourth quadrant of an orthogonal coordinate system in which an origin of the polar coordinate system of the robot mechanism is a common origin and a direction of the grinding portion is a Y-axis positive direction, and such that the origin of the polar coordinate system is positioned on a line of extension of a semiconductor wafer carry-in and carry-out center line of the damaged layer removal treatment portion. The stocker for accommodating the semiconductor wafer before processing which is to be supplied to the grinding portion and/or the semiconductor wafer after processing which has been withdrawn from the damaged layer removal treatment portion is preferably provided at a position at which the wafer can be brought in and brought out by the third wafer transport portion. The cleaning portion can be disposed in one of the first quadrant and the second quadrant of the orthogonal coordinate system. The precenter portion can be disposed in a quadrant of the coordinate system on a side opposite to the cleaning portion, with the Y-axis of the coordinate system being interposed between the precenter portion and the cleaning portion.

According to the present invention, there is further provided a semiconductor wafer processing method for thinning a semiconductor wafer to a target thickness, including the steps of mechanically grinding a side of the semiconductor wafer opposite to a surface thereof, where a circuit has been formed, by a grinding portion; withdrawing the semiconductor wafer after mechanical grinding from the grinding portion, and passing the semiconductor wafer on to the wafer cleaning portion; cleaning the semiconductor wafer passed on to the wafer cleaning portion; withdrawing the semiconductor wafer after cleaning from the wafer cleaning portion and passing the semiconductor wafer on to a damaged layer removal treatment portion; and removing a damaged layer, caused by the mechanical grinding, in the damaged layer removal treatment portion.

The damaged layer removal treatment portion may be a plasma treatment portion for etching the damaged layer by plasma treatment. It is preferred to grind the semiconductor wafer by mechanical grinding to a thickness being a sum of the target thickness and a dry etching margin set in a range of 3 µm to 50 µm, and remove a remainder of the semiconductor wafer by dry etching using plasma treatment. The semiconductor wafer may consist essentially of silicon. After the semiconductor wafer is ground by the mechanical grinding, the semiconductor wafer is preferably cleaned with a liquid before dry etching is performed. The liquid may be water. The damaged layer removal treatment portion may be a wet etching treatment portion for etching the damaged layer with a chemical liquid. Preferably, mechanical grinding and removal of the damaged layer are performed, with a protective film being formed on the surface of the semiconductor wafer where the circuit has been formed.

DETAILED DESCRIPTION OF THE PREFERRED EMBODIMENTS

Embodiments of the present invention will be described by reference to the accompanying drawings.

Figure 1:
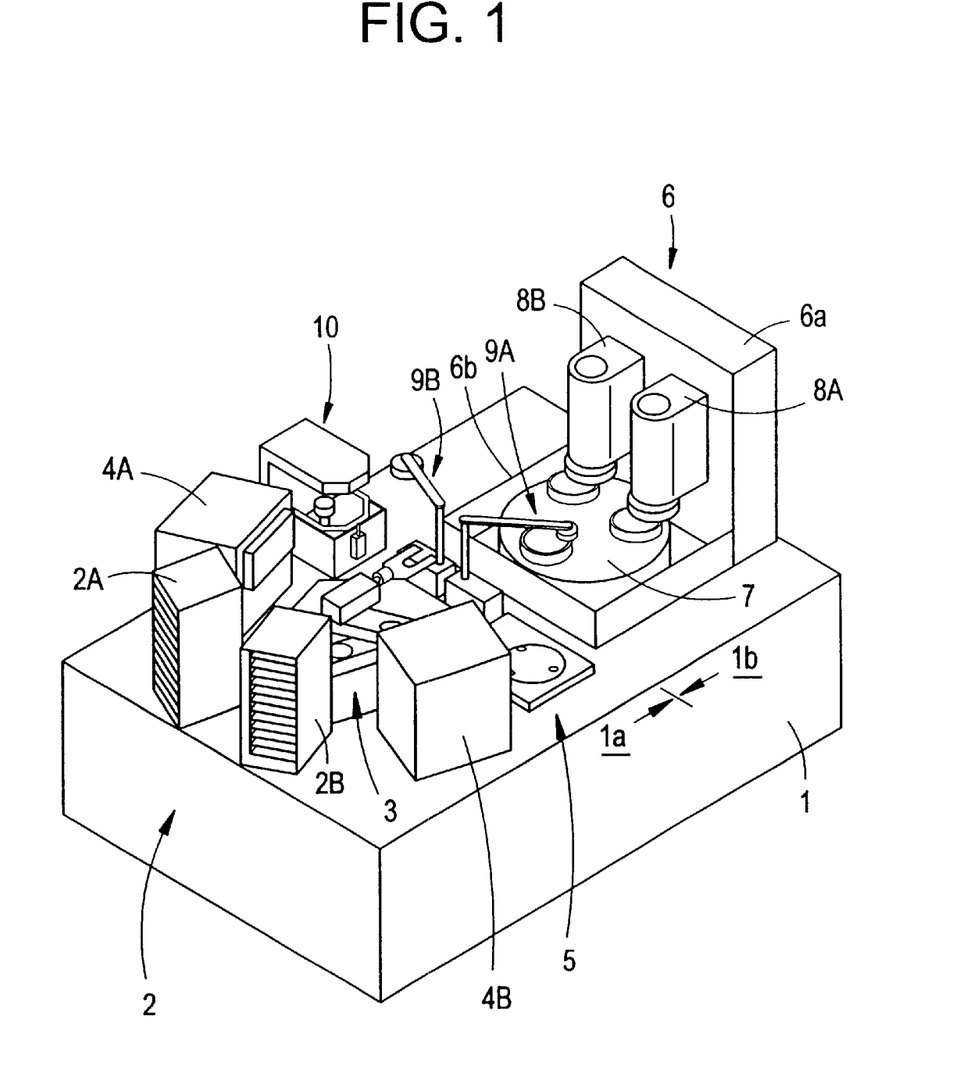
FIG. 1 is a perspective view of a semiconductor wafer processing apparatus as an embodiment of the present invention.
Figure 2:
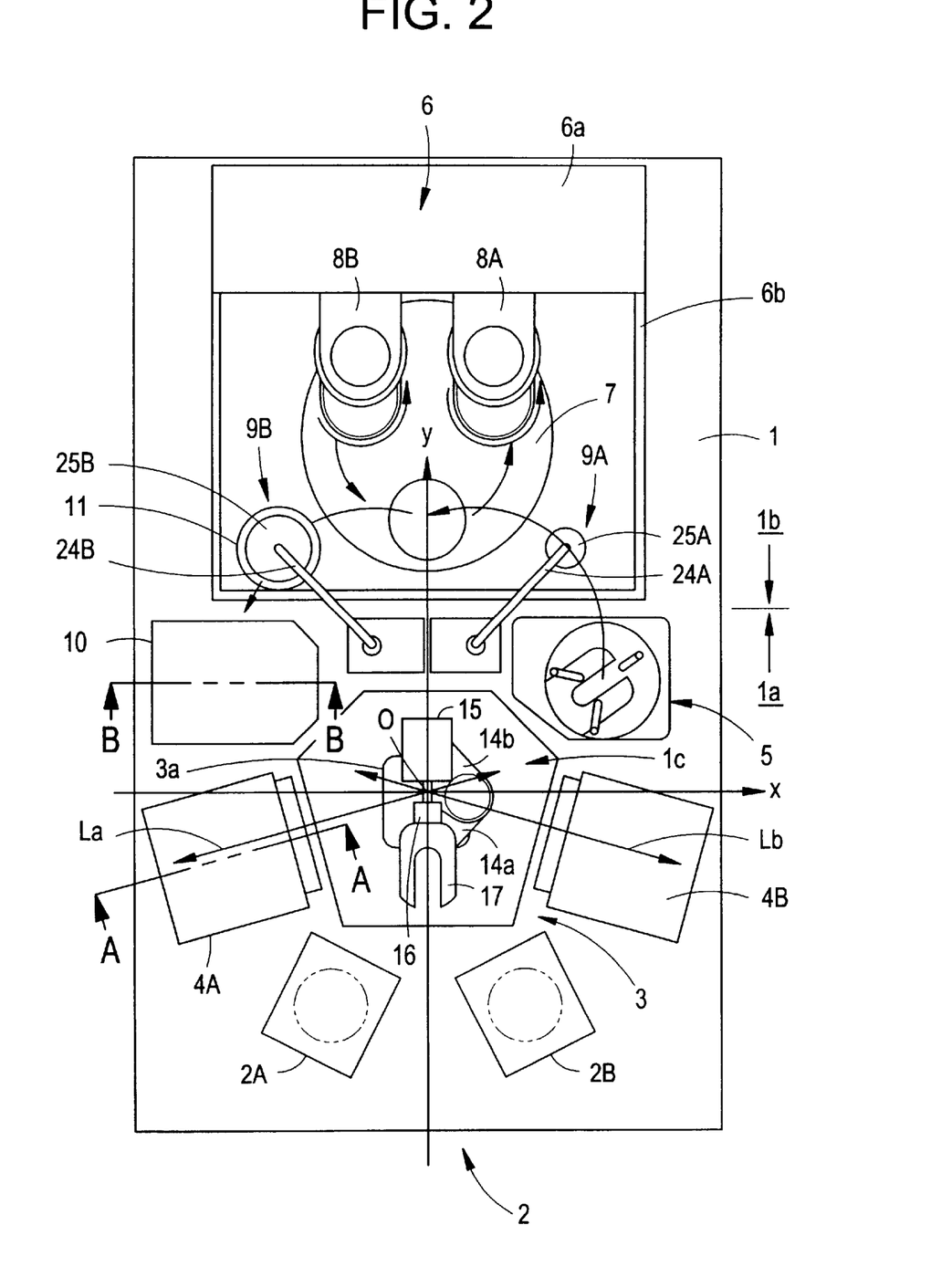
FIG. 2 is a plan view of the semiconductor wafer processing apparatus as the embodiment of the present invention.

The entire structure of a semiconductor wafer processing apparatus will be described with reference to FIGS. 1 and 2. In FIGS. 1 and 2, a third wafer transport portion 3 composed of a robot mechanism on a polar coordinate system is disposed on a front half 1a of an upper surface of a base portion 1. A wafer stocker 2 having magazines (wafer cassettes) 2A, 2B, a first plasma treatment portion 4A, a second plasma treatment portion 4B, a precenter portion 5, and a wafer cleaning portion 10 are disposed radially around the third wafer transport portion 3. The magazines 2A, 2B, first plasma treatment portion 4A, second plasma treatment portion 4B, precenter portion 5, and wafer cleaning portion 10 are arranged in a range in which a wafer can be brought in and out by the third wafer transport portion 3.

The magazines 2A, 2B of the wafer stocker 2 accommodate a plurality of semiconductor wafers before and after processing. The first plasma treatment portion 4A and the second plasma treatment portion 4B remove a damaged layer, caused by mechanical grinding on the surface of a semiconductor wafer 11, by the etching action of a plasma generated in a vacuum atmosphere. Thus, the first plasma treatment portion 4A and the second plasma treatment portion 4B constitute a damaged layer removal treatment portion for the semiconductor wafer.

The precenter portion 5 performs a centering action for preliminarily aligning the semiconductor wafer to be passed on to a grinding portion 6 to be described later on. The wafer cleaning portion 10 cleans the semiconductor wafer, ground by the grinding portion 6, with a cleaning fluid.

The grinding portion 6 for mechanically grinding the semiconductor wafer 11 is disposed on a rear half 1b of the upper surface of the base portion 1. The grinding portion 6 has a wall portion 6a erected on the upper surface of the base portion 1, and a first grinding unit 8A and a second grinding unit 8B are disposed on a front side surface of the wall portion 6a. The first grinding unit 8A and the second grinding unit 8B perform rough grinding and finish grinding, respectively, of the semiconductor wafer 11. A turn table 7 surrounded by a combing 6b is disposed below the first grinding unit 8A and second grinding unit 8B. The turn table 7 makes an index rotation to position the semiconductor wafer, an object to be ground, relative to the first grinding unit 8A and second grinding unit 8B while holding the semiconductor wafer.

Ahead of the grinding portion 6, a first wafer transport portion 9A and a second wafer transport portion 9B are disposed. The first wafer transport portion 9A brings the semiconductor wafer, aligned at the precenter portion 5, into the grinding portion 6. The second wafer transport portion 9B brings the semiconductor wafer after mechanical grinding out of the grinding portion 6. Thus, the aforementioned first wafer transport portion 9A, second wafer transport portion 9B, and third wafer transport portion 3 constitute a wafer transport mechanism for transferring the semiconductor wafer 11 between the grinding portion 6, wafer cleaning portion 10, first plasma treatment portion 4A and second plasma treatment portion 4B, supplying the semiconductor wafer 11 to the grinding portion 6, and withdrawing the semiconductor wafer 11 after dry etching from the first plasma treatment portion 4A and second plasma treatment portion 4B.

Layout of the respective members on the base portion 1 will be described. As shown in FIG. 2, an XY orthogonal coordinate system, having an origin O of the polar coordinate system of the robot mechanism of the third wafer transport portion 3 as a common origin, and having a direction of the grinding portion 6 as a Y-axis positive direction, is set on the base portion 1. In this orthogonal coordinate system, the precenter portion 5, first wafer transport portion 9A and first grinding unit 8A are in the first quadrant, the second grinding unit 8B, second wafer transport portion 9B and wafer cleaning portion 10 are in the second quadrant, the first plasma treatment portion 4A and magazine 2A are in the third quadrant, and the second plasma treatment portion 4B and magazine 2B are in the fourth quadrant.

In this layout, the magazines 2A, 2B, first plasma treatment portion 4A, second plasma treatment portion 4B, precenter portion 5 and wafer cleaning portion 10 are arranged such that their wafer carry-in and carry-out directions agree with the direction of the origin O of the polar coordinate system. The first plasma treatment portion 4A and second plasma treatment portion 4B, in particular, are required to be directed and positioned accurately during carry-in and carry-out of the wafer. Thus, their positions and directions of disposition are set such that the origin O is accurately positioned on lines of extension La, Lb of their wafer carry-in and carry-out center lines.

The constitutions and functions of the respective members will be described sequentially, starting with the third wafer transport portion 3. In FIG. 2, the third wafer transport portion 3 is mounted in a concave 1c formed in the center of the front half 1a. The robot mechanism on the polar coordinate system is disposed on a base member 3a of the third wafer transport portion 3. The base member 3a can be turned 360 degrees by a drive mechanism (not shown) on the base portion 1 about the origin O of the polar coordinate system to control the direction of the robot mechanism freely.

The robot mechanism is constituted by coupling a second turning arm 14b to a first turning arm 14a extending laterally of a vertically expansible arm shaft (not shown) erected on the base member 3a, and mounting a wafer holding portion 17 to a front end of the second turning arm 14b. The wafer holding portion 17 has a bifurcated fork-shaped member 17b having attraction holes 17a provided on an upper surface thereof (see FIG. 4). The wafer holding portion 17 rotates about its axis by a hand rotation mechanism 15, and the inclination of the wafer holding portion 17 is controlled by a wrist mechanism 16. Moreover, the wafer holding portion 17 can be moved forward and backward horizontally by turning the first turning arm 14a and the second turning arm 14b.

Upon driving of the respective members of the robot mechanism, the wafer holding portion 17 moves relative to the objects for transfer of the wafer thereto and therefrom, such as the magazines 2A, 2B, first plasma treatment portion 4A, second plasma treatment portion 4B, precenter portion 5, and wafer cleaning portion 10. As stated earlier, these respective objects of wafer transfer are arranged such that their wafer carry-in and carry-out directions agree with the direction of the origin O of the polar coordinate system. Thus, the semiconductor wafer 11 can be transferred between these objects of wafer transfer by the wafer holding portion 17 of the robot mechanism.

That is, the base member 3a is turned, whereby the wafer holding portion 17 can be pointed in the wafer carry-in and carry-out directions of the objects of wafer transfer. The wafer holding portion 17 is moved forward horizontally by the first turning arm 14a or second turning arm 14b, and can thus be accessed to each member. The wafer holding portion 17 is also moved upward or downward by driving the arm shaft (not shown). By a combination of this upward or downward movement, and switching ON/OFF of vacuum attraction through the attraction holes 17a of the wafer holding portion 17, the semiconductor wafer 11 can be attracted to or released from the wafer holding portion 17. By driving the hand rotation mechanism 15, moreover, the semiconductor wafer 11 attracted to and held by the attraction holes 17a of the wafer holding portion 17 (see FIG. 4) can be turned upside down.

As described above, the respective members, which the wafer is transferred to and from, are arranged radially around the third wafer transport portion 3 using the robot mechanism on the polar coordinate system. Employment of this arrangement makes it possible to cover the plurality of the targets of wafer transfer by a single robot mechanism, and actualize a semiconductor wafer processing apparatus with high work efficiency and of a compact size.

Figure 3:
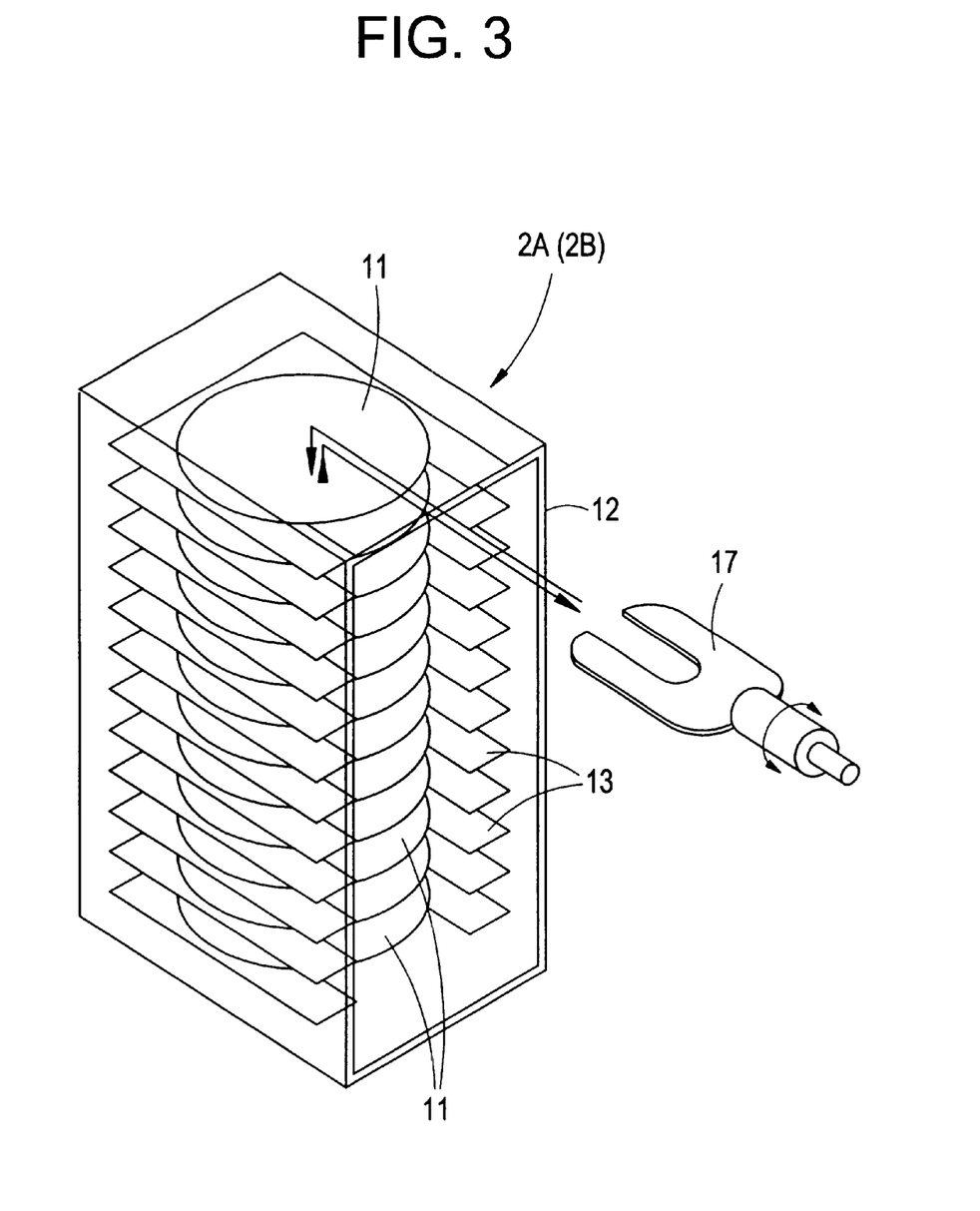
FIG. 3 is a perspective view of a wafer stocker of the semiconductor wafer processing apparatus as the embodiment of the present invention.
Figure 4:
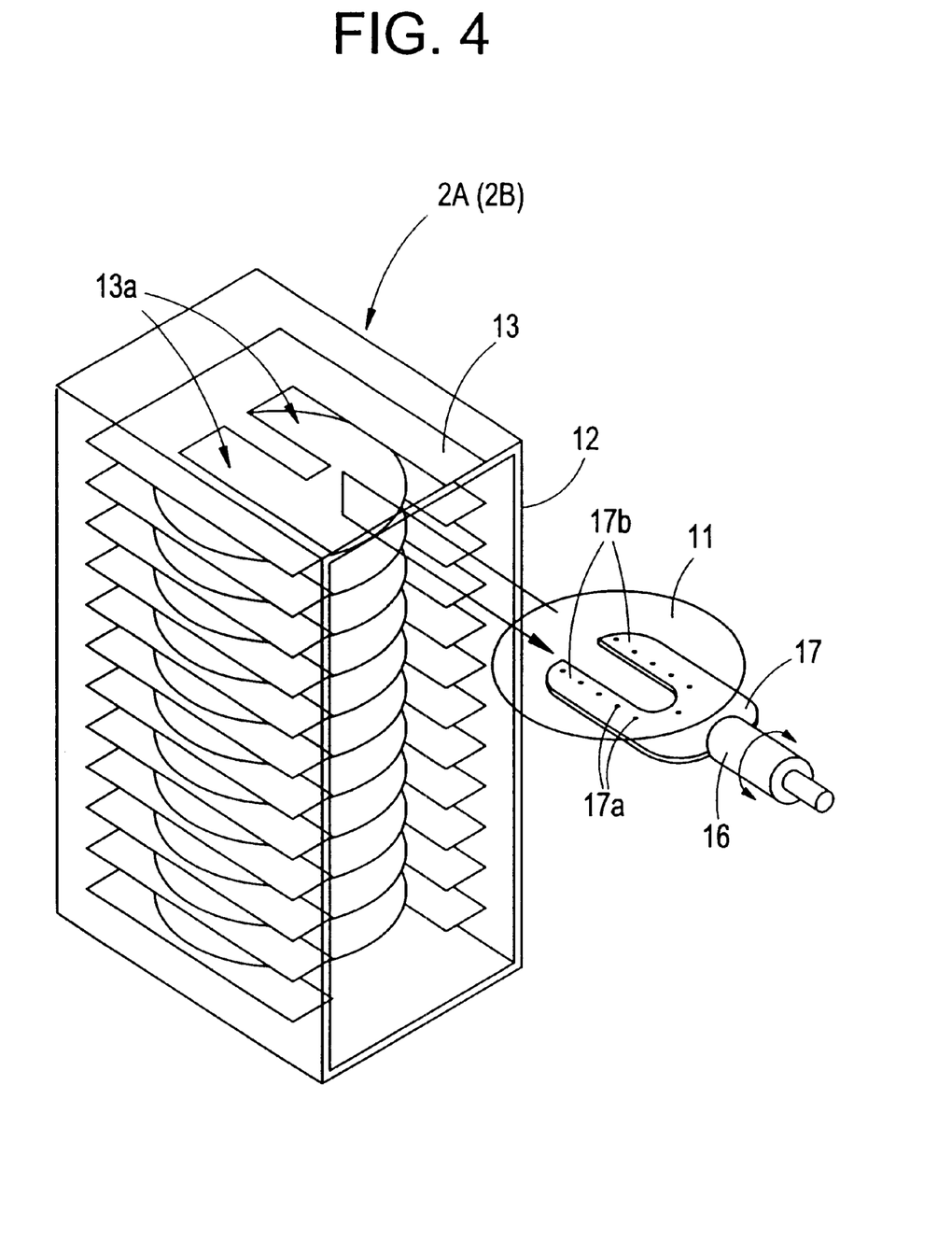
FIG. 4 is a perspective view of the wafer stocker of the semiconductor wafer processing apparatus as the embodiment of the present invention.

Next, the wafer stocker 2 will be described. As shown in FIGS. 1 and 2, the wafer stocker 2 has two magazines 2A and 2B for wafer accommodation. The magazines 2A, 2B accommodate many semiconductor wafers to be thinned. As shown in FIGS. 3 and 4, the magazines 2A, 2B have a structure in which shelf members 13 are provided in many stages inside a housing 12, and a semiconductor wafer 11 is borne on each of the shelf members 13.

The semiconductor wafer 11 consists essentially of silicon, and has a plurality of semiconductor devices built therein. A protective film 11a is formed on the surface of the semiconductor wafer 11 on which a circuit has been formed (see FIG. 10(b)). The protective film 11a protects the circuit pattern of the semiconductor wafer 11, and functions to reinforce the semiconductor wafer 11 and enhance its fracture strength. The protective film 11a is formed by pasting a resin sheet to the circuit-formed surface of the semiconductor wafer 11. In accommodating the semiconductor wafer 11 in the magazine 2A or 2B, the semiconductor wafer 11 is borne on the shelf member 13 with the protective film 11a facing upward.

The actions of the wafer holding portion 17 for withdrawing and accommodating the semiconductor wafer 11 from and into the magazines 2A, 2B will be described. For withdrawal, the wafer holding portion 17 is inserted into a space above the semiconductor wafer 11 accommodated in the magazine 2A (2B), with the attraction holes 17a facing downward, as shown in FIG. 3. Then, the wafer holding portion 17 is lowered until it contacts the upper surface of the semiconductor wafer 11. In this state, vacuum attraction through the attraction holes 17a is carried out, whereby the semiconductor wafer 11 is attracted to and held by the lower surface of the wafer holding portion 17. Then, the wafer holding portion 17 is raised again, and pulled out of the magazine 2A (2B). As a result, the semiconductor wafer 11 is withdrawn while being attracted to and held by the lower surface of the wafer holding portion 17.

FIG. 4 shows an accommodating action for returning the semiconductor wafer 11 into the magazine 2A (2B). For the accommodating action, the semiconductor wafer 11, which has been attracted to and held by the upper surface of the wafer holding portion 17 with the thinned surface of the semiconductor wafer 11 facing upward, is turned upside down by rotating the wafer holding portion 17 about its axis. By so doing, the protective film 11a is directed upward, and the semiconductor wafer 11 is accommodated in this posture into the magazine 2A (2B). At this time, the same semiconductor wafer 11 is returned to the same location where it was accommodated before processing.

This returning is performed by inserting the wafer holding portion 17, which has held the semiconductor wafer 11 on its upper surface, into the magazine 2A (2B), then releasing vacuum attraction, and then lowering the wafer holding portion 17. That is, during this lowering action, the fork-shaped member 17b of the wafer holding portion 17 passes through a notch 13a downward, with the semiconductor wafer 11 being borne on the shelf member 13, as shown in FIG. 4. The wafer holding portion 17 is pulled out of the magazine, whereby accommodation of the semiconductor wafer 11 is completed.

Figure 5:
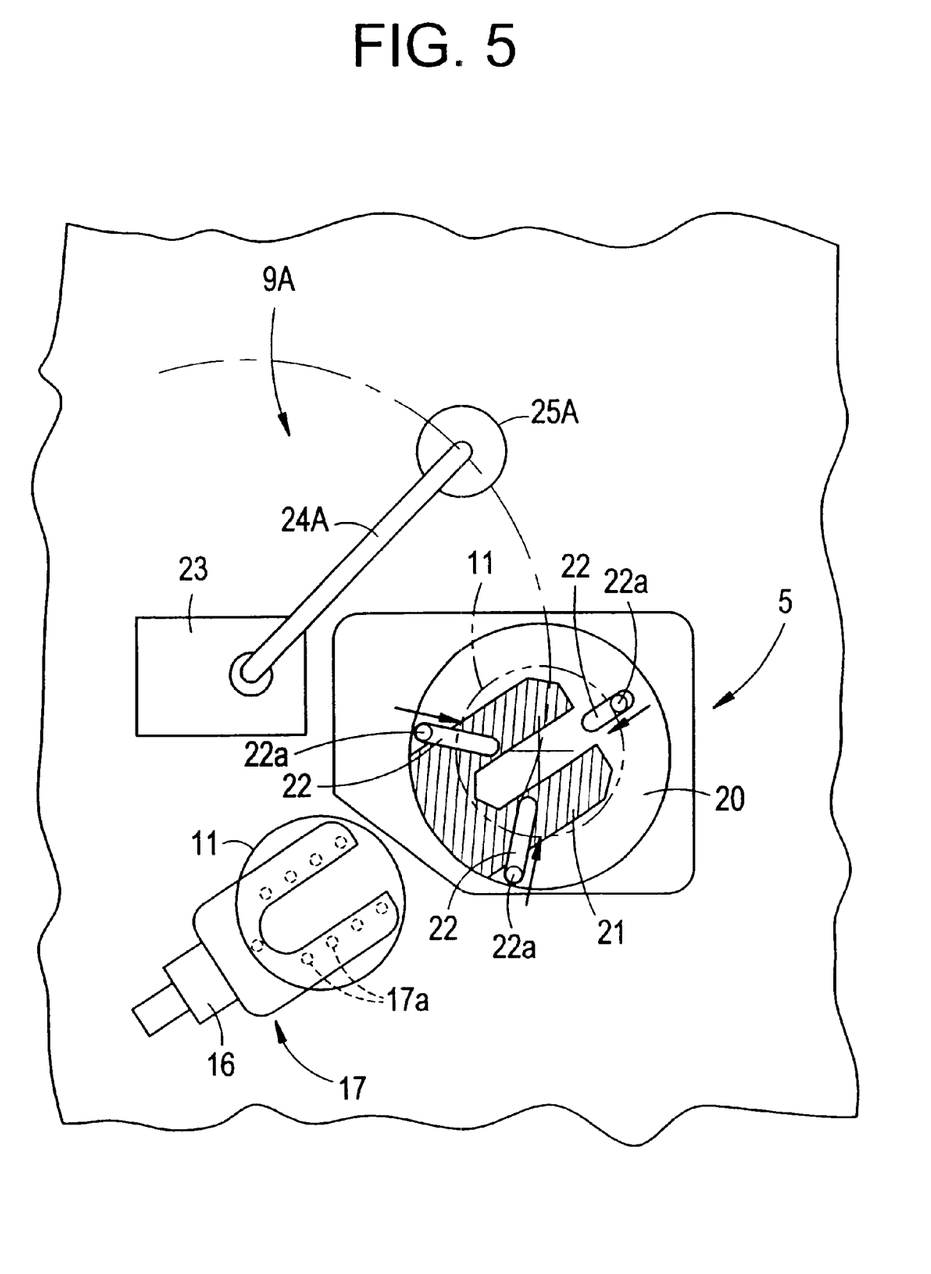
FIG. 5 is a partial plan view of the semiconductor wafer processing apparatus as the embodiment of the present invention.

Next, the precenter portion 5 will be described with reference to FIG. 5. The precenter portion 5 is designed to align the semiconductor wafer 11 to be supplied to the grinding portion 6. In FIG. 5, the precenter portion 5 has a circular bearing table 20. A removed portion 21 (see the hatching) having an upper surface partially removed in correspondence with the shape of the wafer holding portion 17 is formed on the upper surface of the bearing table 20. The depth of the removed portion 21 is set to be a depth in which the wafer holding portion 17 can be accommodated in the removed portion 21.

The semiconductor wafer 11 is carried into the precenter portion 5 in the following manner: The wafer holding portion 17 holding the semiconductor wafer 11 on its upper surface is moved above the bearing table 20 until the horizontal position of the wafer holding portion 17 aligns with the removed portion 21. Then, the wafer holding portion 17 is lowered to a height position at which it is accommodated into the removed portion 21. By this measure, the semiconductor wafer 11 is borne on the bearing table 20. Then, the wafer holding portion 17 is retreated from inside the removed portion 21, whereby carry-in of the semiconductor wafer 11 is completed.

In the bearing table 20, a plurality of grooved portions 22 are provided radially toward the center at 120-degree equal angular positions. Each of the grooved portions 22 has a positioning pawl 22a which is movable along the direction of the groove. The positioning pawl 22a is moved toward the center of the bearing table 20, with the semiconductor wafer 11 being borne on the bearing table 20, whereby the semiconductor wafer 11 is aligned with the central position of the bearing table 20. That is, the precenter portion 5 performs centering of the semiconductor wafer 11 to be supplied to the grinding portion 6.

The first wafer transport portion 9A is disposed adjacent to the precenter portion 5. The first wafer transport portion 9A is constituted by mounting an attracting head 25A to a front end of a transport arm 24A, which is turned and driven upward or downward by an arm drive mechanism 23, as shown in FIG. 5. When the attracting head 25A is moved above the semiconductor wafer 11 of the precenter portion 5 and then lowered, the attracting head 25A attracts and holds the semiconductor wafer 11. Then, the transport arm 24A is raised and turned toward the grinding portion 6, whereby the semiconductor wafer 11 is carried into the grinding portion 6, and moved to a wafer transfer station (to be described later on).

Figure 6:
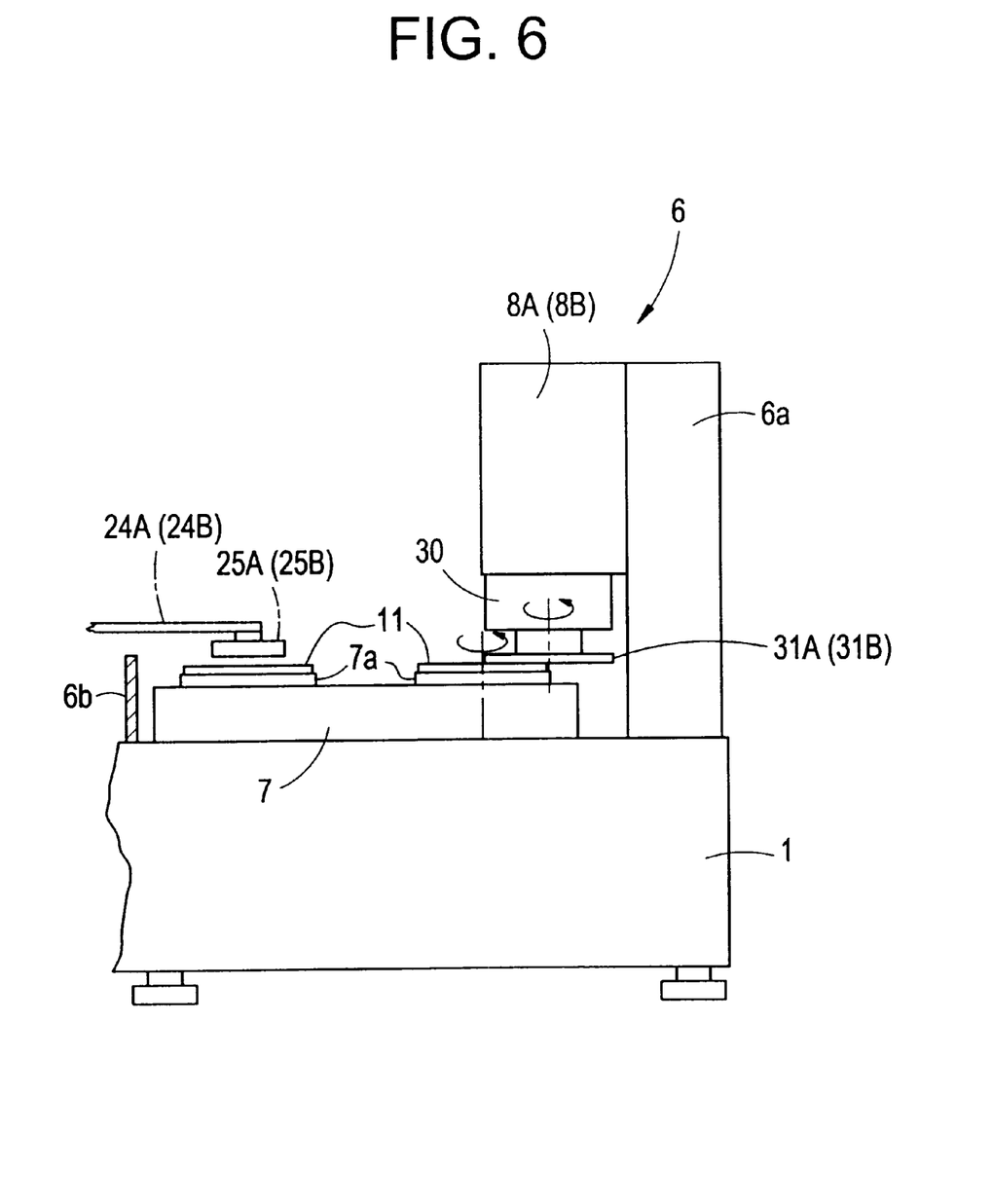
FIG. 6 is a side view of a grinding portion of the semiconductor wafer processing apparatus as the embodiment of the present invention.

Next, the grinding portion 6 will be described with reference to FIGS. 2 and 6. As shown in FIGS. 2 and 6, the turn table 7 is disposed on the upper surface of the base portion 1. The turn table 7 can make an index rotation about its central shaft, and has three chuck tables 7a provided at 120-degree equal angular positions which are index positions.

Each chuck table 7a receives the semiconductor wafer 11 from the transport arm 24A of the first wafer transport portion 9A at the wafer transfer station (a left-hand index position in FIG. 6). The chuck table 7a has the semiconductor wafer 11 attracted to and held on an upper surface thereof, and is rotatable about its axis.

The first grinding unit 8A and the second grinding unit 8B are provided on the side surface of the wall portion 6a erected at the right end of the upper surface of the base portion 1. The first grinding unit 8A and the second grinding unit 8B are arranged in the horizontal direction at positions corresponding to the index positions of the turn table 7. The index positions below the first grinding unit 8A and the second grinding unit 8B define a rough grinding station and a finish grinding station, respectively.

The first grinding unit 8A and the second grinding unit 8B each have a rotary drive portion 30. A grindstone 31A or 31B for rough grinding or finish grinding the semiconductor wafer 11 is mounted on the lower surface of the rotary drive portion 30. For rough grinding, a grindstone of about #500 is used. For finish grinding, a grindstone of #3000 to #4000 is generally used. The first grinding unit 8A and the second grinding unit 8B each ascend and descend by the action of a built-in upwardly and downwardly moving mechanism.

As shown in FIG. 6, the chuck table 7a holding the semiconductor wafer 11 is moved to the index position (grinding position) below the first grinding unit 8A (or second grinding unit 8B). In this state, the grindstone 31A (or 31B) is lowered to contact the upper surface of the semiconductor wafer 11. The grindstone 31A (or 31B) is rotated by the rotary drive portion 30 to grind the upper surface of the semiconductor wafer 11.

When the chuck table 7a is located at the grinding position below the first grinding unit 8A or the second grinding unit 8B, the chuck table 7a is rotated by a drive mechanism (not shown). The rotation of the chuck table 7a and the rotation of the grindstone 31A or 31B are combined, whereby the upper surface of the semiconductor wafer 11 is ground uniformly during grinding.

During the grinding, a grinding liquid is supplied to the ground surface of the semiconductor wafer 11 by grinding liquid supply means (not shown). The grinding liquid is accumulated in the combing 6b provided on the upper surface of the base portion 1 so as to surround the turn table 7, and is discharged to the outside. The semiconductor wafer 11 after grinding is moved to the wafer transfer position by moving the chuck table 7a by the index rotation of the turn table 7. Then, the semiconductor wafer 11 is carried out by the transport arm 24B of the second wafer transport portion 9B.

Figure 7:
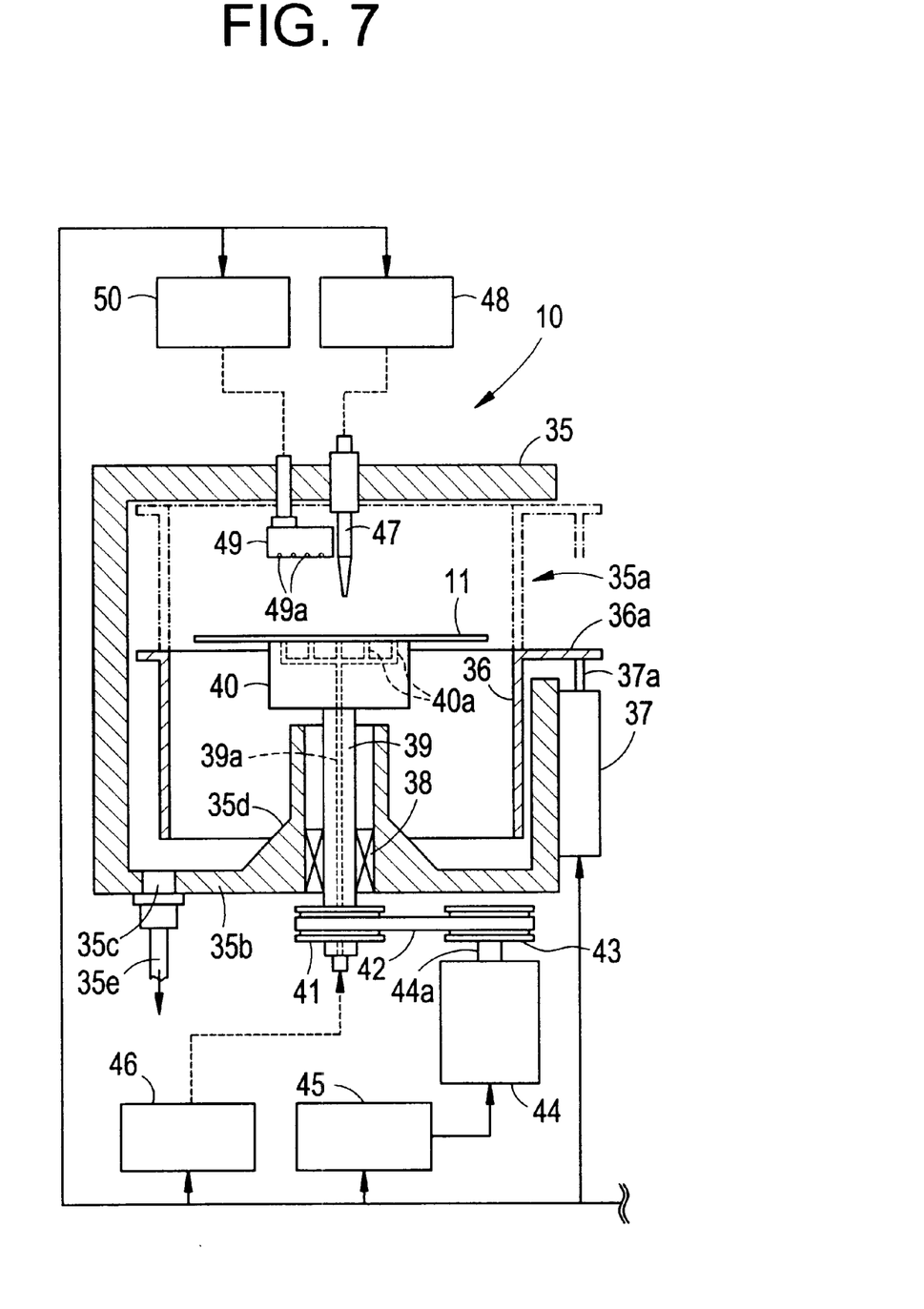
FIG. 7 is a sectional view of a wafer cleaning portion of the semiconductor wafer processing apparatus as the embodiment of the present invention.

Next, the structure of the wafer cleaning portion 10 will be described with reference to FIG. 7. The wafer cleaning portion 10 is disposed on a side opposite to the precenter portion 5, with the Y-axis of the orthogonal coordinate system being interposed between the wafer cleaning portion 10 and the precenter portion 5. In FIG. 7 showing the BB section of FIG. 2, an opening 35a is provided in an upper part of a box-shaped cleaning frame portion 35 by partially cutting out the front surface and two side surfaces of the frame portion 35. The opening 35a has a size which allows the entry and exit of the second wafer transport portion 9B holding the semiconductor wafer 11. At the bottom 35b of the cleaning frame portion 35, there are provided an opening 35c for drainage, and a bearing boss 35d of an upwardly protruding 10 shape. A bearing 38 is fitted into the bearing boss 35d, and a rotary support portion 40 is bound to an upper part of a vertical shaft portion 39 rotatably supported by the bearing 38.

A plurality of attraction holes 40a are provided in a horizontal upper surface of the rotary support portion 40, and the attraction holes 40a communicate with a suction hole 39a provided in the shaft portion 39. Vacuum suction is performed through the suction hole 39a by driving a suction control portion 46 connected to the suction hole 39a, with the semiconductor wafer 11 being borne on the upper surface of the rotary support portion 40. By this vacuum suction, the semiconductor wafer 11 is attracted to and held by the upper surface of the rotary support portion 40.

A pulley 41 is bound to a lower part of the shaft portion 39, and a belt 42 is looped between the pulley 41 and a pulley 43 bound to a rotating shaft 44a of a motor 44. The motor 44 is driven by a motor drive portion 45. The shaft portion 39 is rotated by driving the motor 44. Thus, the semiconductor wafer 11 held by the rotary support portion 40 spins.

Inside the cleaning frame portion 35, a tubular cover portion 36 of a shape surrounding the semiconductor wafer 11 is mounted so as to be movable upward and downward. A rod 37a of a cylinder 37 is bound to a flange portion 36a provided in an upper part of the cover portion 36. The cover portion 36 moves upward and downward upon driving of the cylinder 37. When the cover portion 36 has ascended, the flange portion 36a is located at a position at which it contacts a ceiling surface of the cleaning frame portion 35, whereby the opening 35a is closed with the cover portion 36.

On the ceiling surface of the cleaning frame portion 35, a cleaning fluid nozzle 47 and an air nozzle 49 are disposed, with their ejecting direction facing downward. The cleaning fluid nozzle 47 is connected to a cleaning fluid supply portion 48 for supplying a cleaning fluid such as pure water. By driving the cleaning fluid supply portion 48, a cleaning fluid is ejected from the cleaning fluid nozzle 47 toward the upper surface of the semiconductor wafer 11 supported by the rotary support portion 40.

At this time, the semiconductor wafer 11 is spinning upon driving of the motor 44. The cleaning fluid jetted at the center of the semiconductor wafer 11 flows toward the outer edge of the semiconductor wafer 11 by a centrifugal force. As a result, foreign matter adhering to the upper surface of the semiconductor wafer 11 is removed together with the cleaning fluid, and accumulated on the bottom surface of the cleaning frame portion 35. Then, the foreign matter is guided, together with the cleaning fluid, to waste water treatment equipment (not shown) through the opening 35c and a drainage pipe 35e.

The air nozzle 49 is connected to an air supply portion 50, and air is ejected downward through air holes 49a of the air nozzle 49 by driving the air supply portion 50. Thus, drops of the cleaning fluid adhering to and remaining on the upper surface of the semiconductor wafer 11 after cleaning are removed, so that hydro-extraction and drying are carried out. The above-described actions are performed by controlling the cylinder 37, motor drive portion 45, suction control portion 46, cleaning fluid supply portion 48 and air supply portion 50 by a control portion (not shown) in the body of the apparatus.

Figure 8:
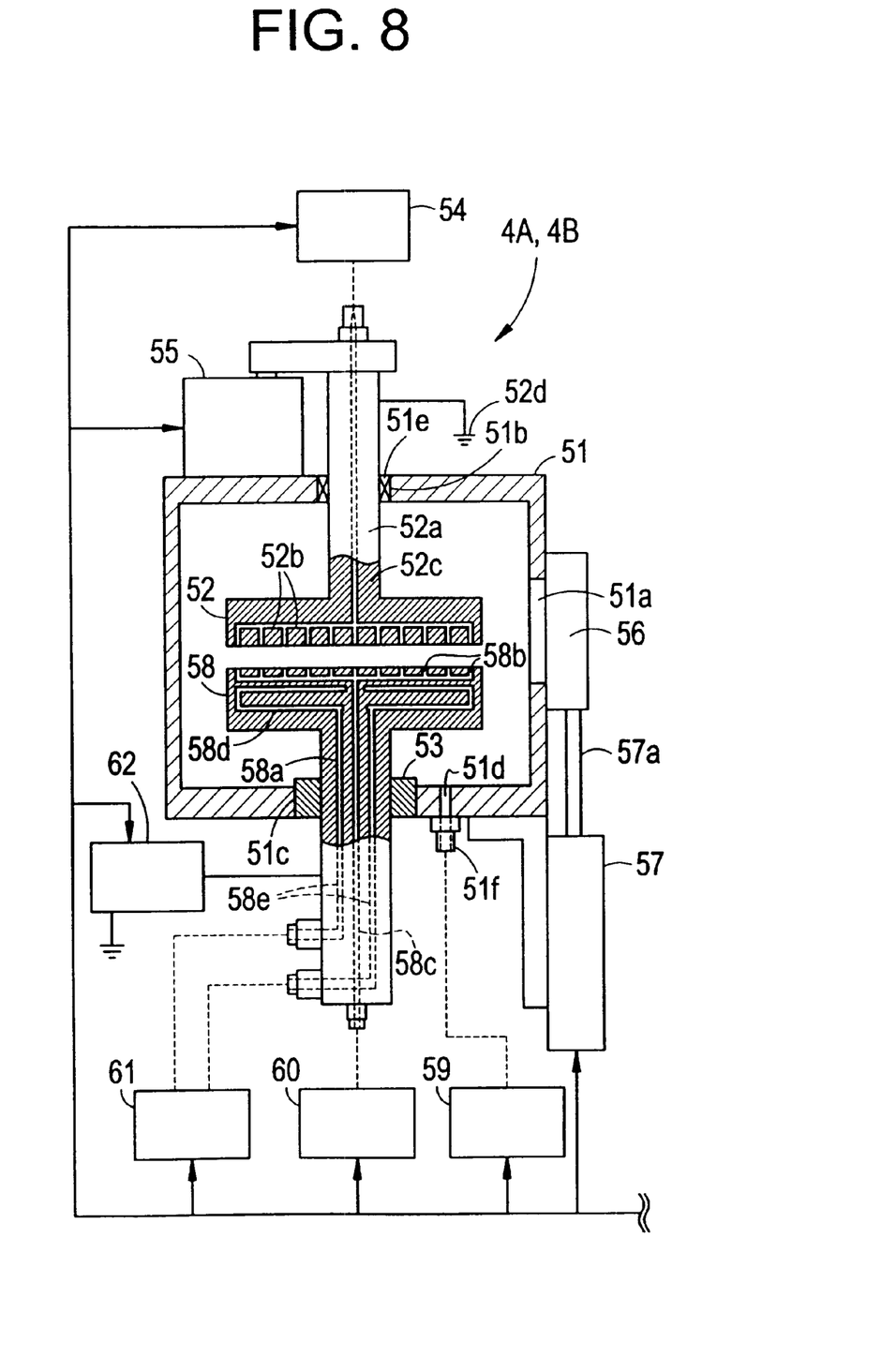
FIG. 8 is a sectional view of a plasma treatment portion of the semiconductor wafer processing apparatus as the embodiment of the present invention.

Next, the first and second plasma treatment portions 4A and 4B will be described with reference to FIG. 8. These two plasma treatment portions have the same functions, and only one or both of them is or are used according to a work load. In FIG. 8 showing the A—A section of FIG. 2, an opening 51a is provided in a side surface of a vacuum chamber 51. The opening 51a is used for carry-in and carry-out of the semiconductor wafer 11, and has such a size as to allow the wafer holding portion 17 holding the semiconductor wafer 11 to come in and go out therethrough. The opening 51a has an up-and-down gate 56, and the gate 56 is bound to a rod 57a of a cylinder 57. By driving the cylinder 57, the gate 56 is raised or lowered to open or close the opening 51a.

Openings 51b and 51c are provided in a ceiling surface and a bottom surface, respectively, of the vacuum chamber 51. A support portion 52a of an upper electrode 52 is inserted into the opening 51b via a vacuum-tight bearing 51e so as to be movable upward and downward. The support portion 52a is bound to an electrode raising and lowering drive portion 55, and the upper electrode 52 is raised and lowered by driving the electrode raising and lowering drive portion 55.

Many gas ejection ports 52b are provided in a lower surface of the upper electrode 52, and the gas ejection ports 52b are connected to a gas supply portion 54 via a borehole 52c provided inside the support portion 52a. The gas supply portion 54 supplies a mixed gas for plasma generation which consists essentially of a fluorine-based gas such as $CF_4$ and oxygen, or a gas mixture of $CF_6$ and He.

A support portion 58a of a lower electrode 58 is inserted vacuum-tight into the opening 51c in the bottom surface of the vacuum chamber 51 via an insulator 53. Many attraction holes 58b are provided in an upper surface of the lower electrode 58, and the attraction holes 58b are connected to a suction control portion 60 via a borehole 58c provided inside the support portion 58a. The suction control portion 60 is driven to perform vacuum suction through the attraction holes 58b, thereby vacuum attracting the semiconductor wafer 11 to the upper surface of the lower electrode 58 and holding it thereon. On the other hand, the suction control portion 60 is driven to impart a positive pressure to the attraction holes 58b, thereby releasing the attracted and held semiconductor wafer 11 from the attracted state.

A cooling hole 58d is provided inside the lower electrode 58, and the cooling hole 58d is connected to an electrode cooling portion 61 via a borehole 58e inside the support portion 58a. The electrode cooling portion 61 is driven to circulate a refrigerant in the cooling hole 58d, whereby heat generated during plasma treatment is transferred from the lower electrode 58 to the refrigerant. Thus, an abnormal rise in the temperature of the lower electrode 58 is prevented, so that damage to the protective film 11a of the semiconductor wafer 11 borne on the lower electrode 58 due to heat can be prevented.

An exhaust hole 51d is provided in the vacuum chamber 51, and the exhaust hole 51d is connected to a gas exhaust portion 59 via a pipe connector 51f. By driving the gas exhaust portion 59, the space inside the vacuum chamber 51 is vacuum exhausted. The lower electrode 58 is electrically connected to a high frequency power source portion 62 via the support portion 58a. The upper electrode 52 is connected to a ground portion 52d via the support portion 52a, and a high frequency voltage is applied between the upper electrode 52 and the lower electrode 58 opposed to each other, by driving the high frequency power source portion 62.

In plasma treatment, the vacuum chamber 51 is closed and its interior is vacuum exhausted, with the semiconductor wafer 11 being borne on and held by the lower electrode 58. Then, a high frequency voltage is applied between the upper electrode 52 and the lower electrode 58, with a mixed gas for plasma generation being supplied from the gas supply portion 54 into the vacuum chamber 51. By this measure, a plasma discharge occurs between the upper electrode 52 and the lower electrode 58. The etching effect of the resulting plasma etches the upper surface of the semiconductor wafer 11 to thin the semiconductor wafer 11.

The gas supply portion 54, electrode raising and lowering drive portion 55, gas exhaust portion 59, suction control portion 60, electrode cooling portion 61, and high frequency power source portion 62 are controlled by the control portion (not shown) of the present apparatus, whereby the above-mentioned plasma treatment action is performed. At this time, data on the gas flow rate are transmitted from the gas supply portion 54 to the control portion, data on the chamber internal pressure are transmitted from the gas exhaust portion 59 to the control portion, and data on the refrigerant temperature (i.e., the electrode temperature) are transmitted from the suction control portion 60 to the control portion. Based on these data, the control portion controls plasma treatment actions.

The semiconductor wafer processing apparatus is constituted as described above, and thinning of the semiconductor wafer will be described. This thinning is performed after the protective film 11a is formed on the circuit-formed surface of the semiconductor wafer 11 having a plurality of semiconductor devices built therein.

The semiconductor wafer 11 is supplied in a state in which it is accommodated into the magazine 2A (2B), with the protective film 11a facing upward, as shown in FIG. 3. The semiconductor wafer 11 is withdrawn, with the protective film 11a side being vacuum attracted to the wafer holding portion 17, as shown in FIG. 3. The wafer holding portion 17 having the semiconductor wafer 11 attracted to and held by its lower surface is moved to the precenter portion 5 by the robot mechanism of the third wafer transport portion 3.

The wafer holding portion 17 is rotated about its axis to turn the semiconductor wafer 11, which has been attracted to and held by the wafer holding portion 17, upside down. As a result, the semiconductor wafer 11 comes into a state in which it is attracted to and held by the upper surface of the wafer holding portion 17, with the protective film 11a facing downward, as shown in FIG. 5. Then, the wafer holding portion 17 is lowered, whereby the semiconductor wafer 11 is borne on the bearing table 20, with the protective film 11a facing downward. Then, when the wafer holding portion 17 has retreated from inside the groove portion 21, the positioning pawls 22a push the outer peripheral portion of the semiconductor wafer 11 toward the center from three directions. In this manner, alignment of the semiconductor wafer 11, i.e., its centering action, is performed.

Then, the semiconductor wafer 11 aligned by the centering action is picked up by the attracting head 25A of the first wafer transport portion 9A, and passed on to the grinding portion 6 as shown in FIG. 6. That is, the attracting head 25A is moved to the wafer transfer position, where the semiconductor wafer 11 is transferred onto the chuck table 7a.

Then, mechanical grinding by the grinding portion 6 is carried out. First, the chuck table 7a holding the semiconductor wafer 11 is moved to the rough grinding station below the first grinding unit 8A, and rough grinding with the grindstone 31A is performed there. Then, the chuck table 7a is moved to the finish grinding station, where finish grinding using the grindstone 31B of finer abrasive grains is performed by the second grinding unit 8B. At this time, the semiconductor wafer 11 is thinned to a dimension greater by a predetermined thickness than a predetermined target thickness dimension, namely, a sum of the target thickness and a dry etching margin set in the range of 3 $\mu$m to 50 $\mu$m.

When finish grinding is completed, the chuck table 7a holding the semiconductor wafer 11 is moved again to the wafer transfer station by the index rotation of the turn table 7. This semiconductor wafer 11 is picked up by the attracting head 25B of the second wafer transport portion 9B, and is moved to the wafer cleaning portion 10 by turning the transport arm 24B. Thus, the second wafer transport portion 9B serves as a before-cleaning transport portion for withdrawing the semiconductor wafer 11 after grinding from the grinding portion 6 and passing it on to the wafer cleaning portion 10.

During the carry-out action for the semiconductor wafer 11, fracture strength is reinforced even if a mechanical damaged layer has been generated by mechanical grinding, since the protective film 11a is formed in the semiconductor wafer 11 according to the present embodiment. Thus, breakage of the semiconductor wafer 11 during transport can be prevented.

Figure 11:
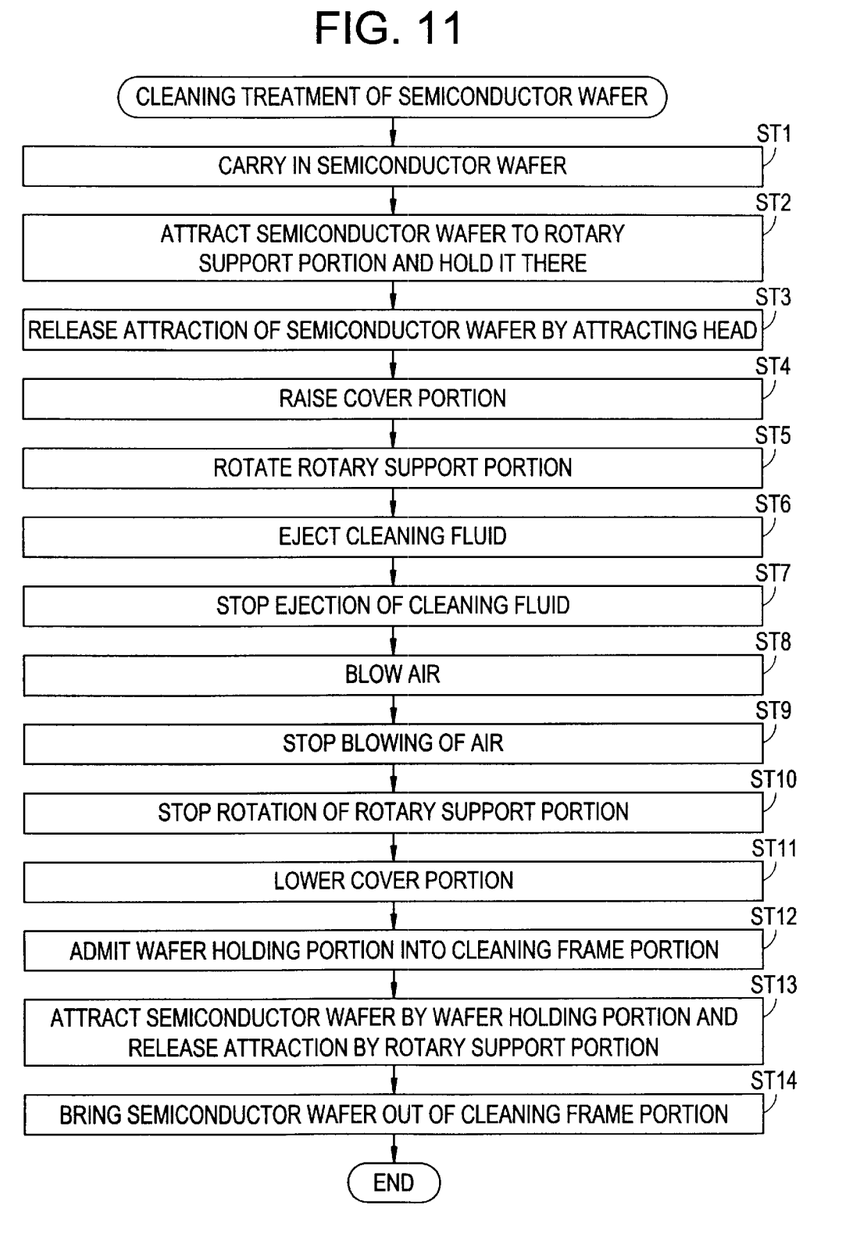
FIG. 11 is a flow chart for cleaning of a semiconductor wafer in the semiconductor wafer processing method as the embodiment of the present invention.

Next, the cleaning action at the wafer cleaning portion 10 will be described in accordance with a flow shown in FIG. 11. With the cover portion 36 being lowered in FIG. 7, the transport arm 24B of the second wafer transport portion 9B is turned to bring the semiconductor wafer 11, held by the attracting head 25B, into the cleaning frame portion 35 and place it on the rotary support portion 40 (ST1).

Then, the semiconductor wafer 11 is attracted to and held by the rotary support portion 40 by vacuum suction through the attraction holes 40a (ST2), and the attraction of the semiconductor wafer 11 by the attracting head 25B is released (ST3). After the transport arm 24B is retreated to the outside, the cover portion 36 is raised (ST4). As a result, the semiconductor wafer 11 has its surroundings closed inside the cleaning frame portion 35, so that ejection of the cleaning fluid becomes possible.

Then, the motor 44 is driven to rotate the rotary support portion 40 and spin the semiconductor wafer 11 (ST5). In this state, the cleaning fluid is jetted through the cleaning nozzle 47 (ST6), and ejection of the cleaning fluid is stopped after a lapse of a predetermined cleaning time (ST7). Then, air is blown through the air nozzle 49 (ST8) to carry out hydro-extraction and drying of the upper surface of the semiconductor wafer 11. After a lapse of a predetermined time, blowing of air is stopped (ST9), whereafter the rotation of the rotary support portion 40 is stopped (ST10). By this procedure, cleaning, hydro-extraction, and drying are completed.

Then, the cover portion 36 is lowered (ST11), whereafter the robot mechanism of the third wafer transport portion 3 is driven to admit the wafer holding portion 17 into the cleaning frame portion 35 (ST12). Then, the upper surface of the semiconductor wafer 11 is attracted by the attraction holes 17a of the wafer holding portion 17, and the attraction by the attraction holes 40a of the rotary support portion 40 is released (ST13). Then, the wafer holding portion 17 picking up the semiconductor wafer 11 is raised, and brought out of the cleaning frame portion 35 (ST14).

Then, the semiconductor wafer 11 rid of foreign matter on the surface by cleaning is moved to the first plasma treatment portion 4A or the second plasma treatment portion 4B, where plasma etching (dry etching) is performed. The plasma etching is intended to plasma etch the surface of the semiconductor wafer 11, which has been thinned by mechanical grinding to the dimension thicker than the target thickness by the dry etching margin set in the range of 3 $\mu$m to 50 $\mu$m, to remove the dry etching margin, thereby thinning the semiconductor wafer 11 to the target thickness.

When finish grinding is performed using a #3000 to #4000 grindstone, the dry etching margin is desirably set at about 5 $\mu$m to 6 $\mu$m. By so doing, the percentage of application of mechanical grinding, which is excellent in the grinding efficiency, can be maximized to improve the work efficiency. Also, a mechanical damaged layer (generally 3 $\mu$m to 5 $\mu$m formed by finish grinding can be removed completely. Consequently, the work efficiency and the quality after removal can both be ensured.

Figure 9A:
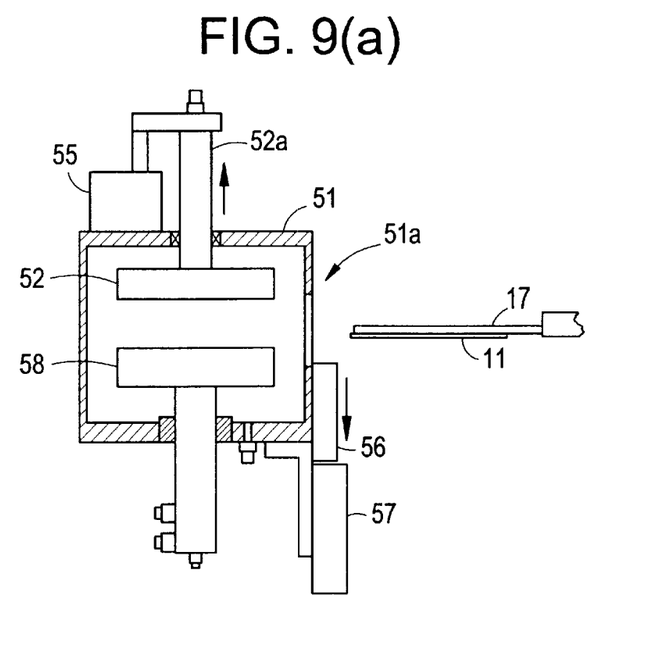
FIGS. 9(a) and 9(b) are each a process explanation drawing of a semiconductor wafer processing method as an embodiment of the present invention.

The plasma etching will be described with reference to FIGS. 9(a) to 9(b) and 10(a) to 10(b). As shown in FIG. 9(a), the wafer holding portion 17 having the cleaned semiconductor wafer 11 attracted to and held by the lower surface thereof is moved from the wafer cleaning portion 10 to a space beside the opening 51a of the vacuum chamber 51 by the robot mechanism of the third wafer transport portion 3. At this time, the gate 56 is lowered to open the opening 51a, while the upper electrode 52 is raised by the electrode raising and lowering drive portion 55 to widen the spacing between the upper electrode 52 and the lower electrode 58. The widened spacing between the upper electrode 52 and the lower electrode 58 is intended to avoid an impediment to transport of the wafer by the third wafer transport portion 3. The third wafer transport portion 3 serves as an after-cleaning transport portion for withdrawing the semiconductor wafer 11 after cleaning from the wafer cleaning portion 10, and passing it on to the plasma treatment portion 4A or 4B.

Figure 9B:
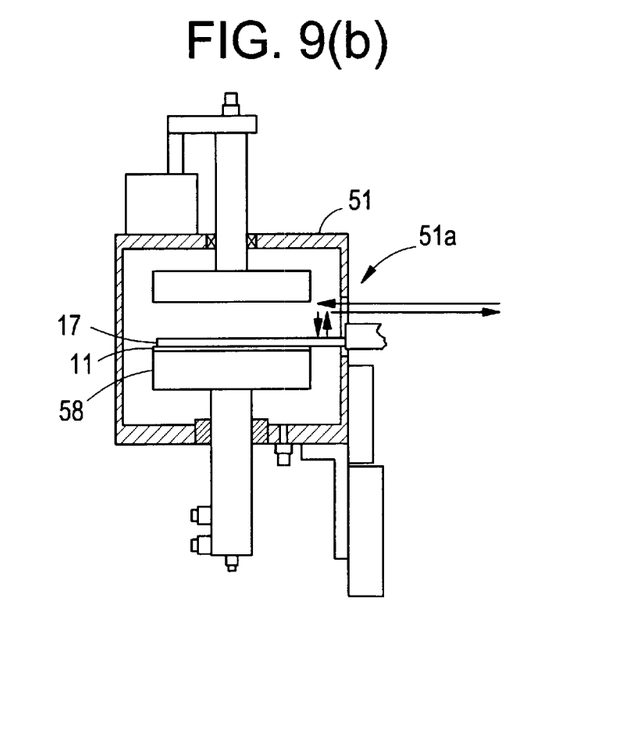

Then, as shown in FIG. 9(b), the wafer holding portion 17 is admitted into the vacuum chamber 51 via the opening 51a, and then lowered to place the semiconductor wafer 11, held by the lower surface of the wafer holding portion 17, on the upper surface of the lower electrode 58. Then, the attraction by the wafer holding portion 17 is released, and at the same time, the protective film 11a of the semiconductor wafer 11 is attracted to and held by the attraction holes 58b of the lower electrode 58. The plasma treatment portions 4A and 4B are arranged such that during the carriage of the semiconductor wafer 11 into and out of the plasma treatment portion 4A or 4B, the origin O is located on a line of extension of the carry-in and carry-out center line La or Lb of the plasma treatment portion 4A or 4B (see FIG. 2). Thus, the carry-in and carry-out actions with a high directional accuracy can be achieved.

Figure 10A:
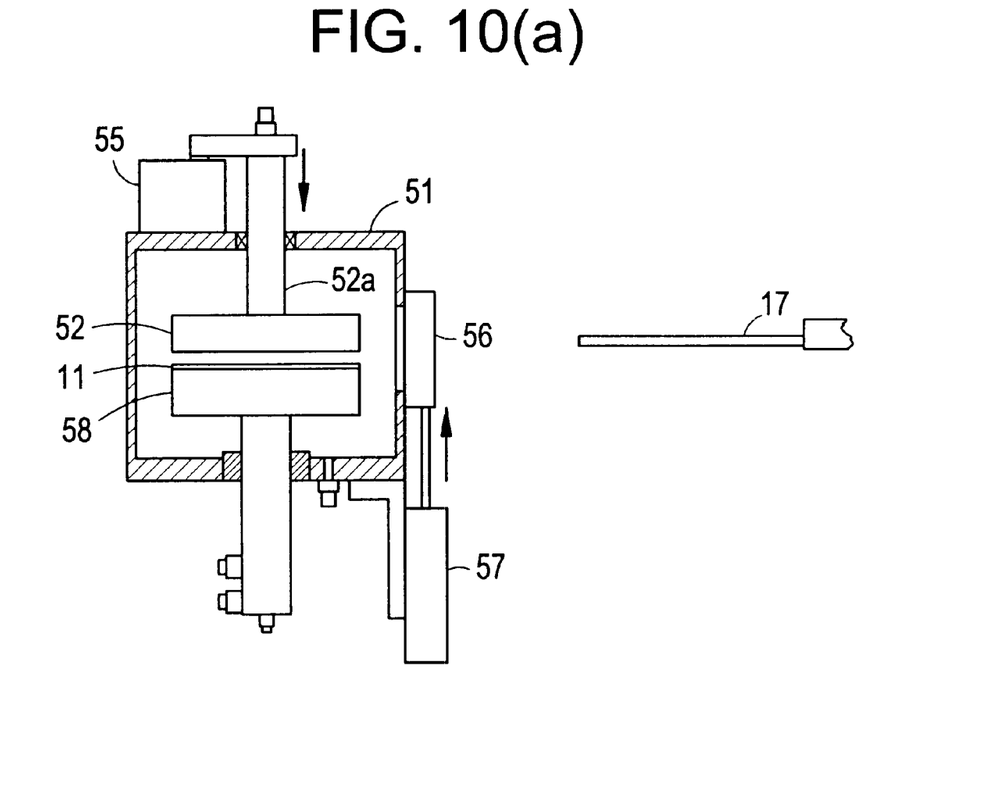
FIGS. 10(a) and 10(b) are each a process explanation drawing of a semiconductor wafer processing method as an embodiment of the present invention.
Figure 10B:
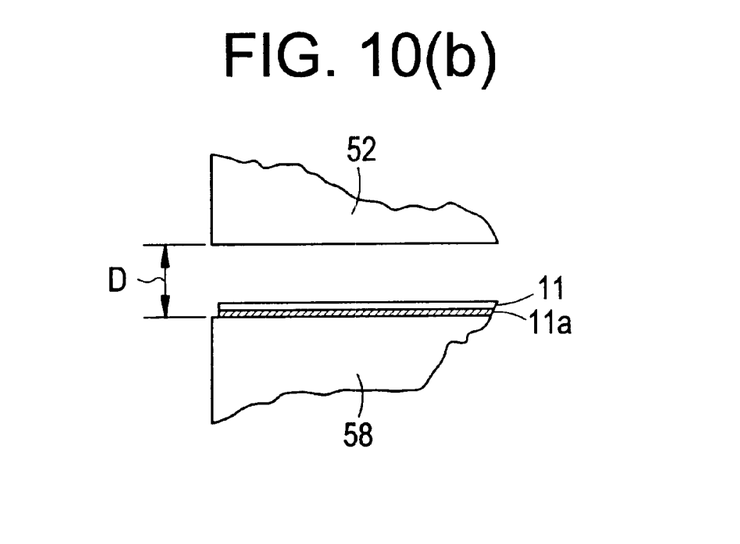

Then, the wafer holding portion 17 is raised and retreated to the outside. Then, as shown in FIG. 10(a), the cylinder 57 is driven to raise the gate 56, shutting the vacuum chamber 51. Then, the electrode raising and lowering drive portion 55 is driven to lower the upper electrode 52, thereby setting the distance between the lower surface of the upper electrode 52 and the upper surface of the lower electrode 58 at a predetermined interelectrode distance D suitable for plasma etching, as shown in FIG. 10(b).

In this state, the aforementioned plasma etching treatment is performed. That is, after the interior of the vacuum chamber 51 is evacuated, a mixture of a fluorine-based gas and an oxygen gas, or a mixture of a fluorine gas and a helium gas is ejected as a plasma generation gas from the gas ejection ports 52b in the lower surface of the upper electrode 52, and the interior of the vacuum chamber 51 is maintained at a predetermined gas pressure. In this state, a high frequency voltage is applied between the upper electrode 52 and the lower electrode 58. By this measure, a plasma discharge is generated in the space between the upper electrode 52 and the lower electrode 58. By the action of active substances formed by the plasma discharge, the silicon on the surface of the semiconductor silicon is removed.

The plasma etching treatment is performed continuously until the semiconductor wafer 11 reaches a target thickness. By this treatment, the mechanical damaged layer produced on the surface of the semiconductor wafer 11 during the mechanical grinding step is removed. The microcrack introduction layer is usually formed with a thickness of 3 $\mu$m to 5 $\mu$m. Thus, the semiconductor wafer 11 is mechanically ground to a dimension taking into consideration the mechanical damaged layer added to the target thickness as stated earlier. Then, the thickness corresponding to the mechanical damaged layer is removed by plasma etching, whereby the mechanical damaged layer is completely eliminated, and the semiconductor wafer 11 is processed to the desired thickness.

The semiconductor wafer 11 after completion of plasma etching is withdrawn by the wafer holding portion 17 of the third wafer transport portion 3, and accommodated to the same position of the magazine 2A (or 2B) of the wafer accommodating portion 2 from which the semiconductor wafer 11 was withdrawn. This action is continuously repeated for other semiconductor wafers 11. In this transport of the semiconductor wafer 11 after thinning, breakage of the semiconductor wafer 11 does not occur, because the damaged layer has been completely eliminated as stated above, and thus the fracture strength of the semiconductor wafer 11 has been improved.

According to the present embodiment, as described above, breakage occurring in the manufacturing process, such as during transport of the semiconductor wafer 11, due to microcracks, can be prevented, and processing yield can be increased. In the present embodiment, moreover, the respective portions in charge of respective functions, such as mechanical grinding, cleaning, and removal of the damaged layer, are connected by the single robot mechanism. Thus, the area for installation of equipment can be reduced to cut down on the equipment cost. Furthermore, the number of changed grippings of the semiconductor wafer 11 during transport can be minimized in comparison with a conventional system, i.e., a system for transferring a semiconductor wafer among a plurality of separate devices by use of transport means such as a robot. Hence, the aforementioned processing yield can be further increased by decreasing the probability of breakage occurrence of the semiconductor wafer during handling.

According to the semiconductor wafer processing apparatus illustrated in the present embodiment, moreover, the regions for the grinding portion 6 and the other respective portions are disposed separately on the common base portion 1, and transfer of the semiconductor wafer 11 is performed between these portions by separate transfer mechanisms. That is, the transport of the semiconductor wafer 11 in a contaminant-adhered state in the work region (see the rear half 1b shown in FIGS. 1 and 2) in which a grinding liquid is used and adhesion of contaminant such as grinding grains is unavoidable, and the transport of the semiconductor wafer 11 in a clean state in the clean room region (see the front half 1a shown in FIGS. 1 and 2) for plasma etching treatment for which a high degree of cleanness is required of the object to be treated are performed separately by separate transport mechanisms.

Thus, the transport mechanism in the clean room region is not contaminated by adhesion of contaminant. In plasma etching treatment aimed at removing the mechanical damaged layer, therefore, the surface of the semiconductor wafer 11 is free from adhesion of foreign matter which inhibits the etching effect, so that the damaged layer on the surface of the semiconductor wafer 11 can be completely eliminated, and the fracture strength can be enhanced.

The present invention is not limited to the above-described embodiments, and various changes and modifications may be made. In the present embodiment, for example, mechanical grinding is performed in two stages, the rough grinding step and the finish grinding step, but the finish grinding step may be omitted. In this case, a coarse grindstone is used for grinding, so that the depth of the damaged layer on the upper surface of the wafer is 10 $\mu$m or more. Thus, the dry etching margin measuring about 50 $\mu$m is left, and the remainder is processed by dry etching to the target thickness. By so doing, the damaged layer can be removed completely. By performing mechanical grinding in a single stage involving only the rough grinding step, the grinding portion can be downsized, and a semiconductor wafer processing apparatus with a small installation floor area can be actualized.

In the present embodiment, furthermore, the precenter portion 5 and the first wafer transport portion 9A are disposed in the first quadrant of the orthogonal coordinate system, while the second wafer transport portion 9B and the wafer cleaning portion 10 are disposed in the second quadrant. However, these positions may be interchanged, and the second wafer transport portion 9B and the wafer cleaning portion 10 may be disposed in the first quadrant.

In the present embodiment, moreover, there is shown an example in which the damaged layer removal treatment portion uses dry etching by plasma treatment. However, this example is not limitative, and the removal treatment portion may rely on wet etching for etch removing the damaged layer with the use of a chemical liquid such as hydrofluoric acid or nitric acid. That is, a wet etching treatment portion may be disposed instead of the first and second plasma treatment portions 4A and 4B. The wet etching treatment portion may be a spin coater which is used in the step of forming a circuit in a semiconductor wafer.

According to the present invention, a grinding portion for mechanically grinding a semiconductor wafer, a wafer cleaning portion for receiving and cleaning the semiconductor wafer after grinding, a damaged layer removal treatment portion for removing a damaged layer in the semiconductor wafer after cleaning, and a wafer transport mechanism having a robot mechanism on a polar coordinate system for transferring the semiconductor wafer between the grinding portion, the wafer cleaning portion, and the damaged layer removal treatment portion are provided in the same apparatus. Thus, the number of changed grippings of the semiconductor wafer can be minimized, breakage of the semiconductor wafer can be prevented to increase the processing yield, and the equipment can be made compact.

What we claim is:

1. A semiconductor wafer processing method for thinning a semiconductor wafer to a target thickness, including the steps of:

forming a protective film on a surface of a first side of the semiconductor wafer where a circuit has been formed;

after the step of forming the protective film, mechanically grinding a second side of the semiconductor wafer opposite to the first side by a grinding portion to provide a ground side of the wafer;

withdrawing the semiconductor wafer after mechanical grinding from the grinding portion, and passing the semiconductor wafer on to a wafer cleaning portion;

cleaning the ground side of the semiconductor wafer passed on to the wafer cleaning portion by a fluid so as to rid the ground side of foreign matter;

drying the semiconductor wafer at the wafer cleaning portion after cleaning;

withdrawing the dried semiconductor wafer from the wafer cleaning portion, and passing the semiconductor wafer into a vacuum chamber having an upper electrode and a lower electrode, so that the semiconductor wafer is held on the lower electrode with the protective film in contact with an upper surface of the lower electrode; and evacuating the interior of the vacuum chamber, then ejecting a plasma generation gas from a lower surface of the upper electrode and applying a high frequency voltage between the upper electrode and the lower electrode, so that plasma is generated between the upper electrode and the lower electrode whereby a damaged layer, caused by the mechanical grinding, is removed by plasma etching.

2. The semiconductor wafer processing method of claim 1, wherein the semiconductor wafer is ground by the mechanical grinding to a thickness being a sum of the target thickness and a plasma etching margin set in a range of 3 $\mu$m to 50 $\mu$m, and the plasma etching margin is removed by the plasma etching.

3. The semiconductor wafer processing method of claim 1, wherein the semiconductor wafer consists essentially of silicon.

4. The semiconductor wafer processing method of claim 1, wherein the cleaning fluid is water.

* * * * *